United States Patent [19]

Yasuda

[11] Patent Number: 5,357,534
[45] Date of Patent: Oct. 18, 1994

[54] LIGHT BEAM SCANNING RECORDING APPARATUS

[75] Inventor: Hiroaki Yasuda, Kanagawa, Japan

[73] Assignee: Fuji Photo Film Co., Ltd., Kanagawa, Japan

[21] Appl. No.: 87,893

[22] Filed: Jul. 9, 1993

[30] Foreign Application Priority Data

Jul. 28, 1992 [JP] Japan .................. 4-201276

[51] Int. Cl.[5] ................................. H01S 3/10
[52] U.S. Cl. ......................... 372/24; 372/29;
372/26; 372/31; 372/38
[58] Field of Search ............... 372/24, 28, 46, 33,
372/29, 26, 31, 38; 369/122

[56] References Cited

U.S. PATENT DOCUMENTS

| | | | |
|---|---|---|---|
| 4,480,325 | 10/1984 | Aiki et al. | 372/43 X |
| 4,712,218 | 12/1987 | Ohnuki et al. | 372/38 |
| 4,819,242 | 4/1989 | Kaku et al. | 372/29 |
| 4,831,626 | 5/1989 | Watanabe et al. | 372/29 |
| 4,835,781 | 5/1989 | Shoji | 372/29 |
| 4,849,980 | 7/1989 | Shoji et al. | 372/29 |
| 4,977,561 | 12/1990 | Ibe et al. | 372/28 X |
| 5,283,793 | 2/1994 | Shoji | 372/24 |

FOREIGN PATENT DOCUMENTS 59-9086  2/1984  Japan .

OTHER PUBLICATIONS

English language abstract for Japanese Patent Pubication No. 59-9086, Kunio et al, Apr. 11, 1980.

Primary Examiner—Rodney B. Bovernick
Assistant Examiner—Hemang Sanghavi
Attorney, Agent, or Firm—Sughrue, Mion, Zinn, Macpeak & Seas

[57] ABSTRACT

In a light beam scanning recording apparatus, a recording material is scanned with a laser beam having been produced by a single-longitudinal-mode semiconductor laser and having been directly modulated in accordance with an image signal, and a continuous tone image is thereby recorded on the recording material. A device superimposes a radio-frequency current upon a drive current for the semiconductor laser. An amplitude of the radio-frequency current is set at a value, which causes the semiconductor laser to oscillate in a multiple longitudinal mode, when the drive current for the semiconductor laser falls within a range such that an optical output power yielding a recorded optical density of not higher than approximately 2.0 may be obtained. Nonuniformity in image density is thereby prevented from occurring in the recorded image, and the cost of the apparatus is prevented from becoming markedly high due to countermeasures for nonuniformity in image density.

2 Claims, 3 Drawing Sheets

LIGHT BEAM SCANNING RECORDING APPARATUS

BACKGROUND OF THE INVENTION

1. Field of the Invention

This invention relates to a light beam scanning recording apparatus, wherein a recording material, such as a photosensitive material, is scanned with a light beam, which has been modulated, and a continuous tone image is thereby recorded on the recording material. This invention particularly relates to a light beam scanning recording apparatus, wherein a laser beam produced by a single-longitudinal-mode semiconductor laser is utilized as the recording light beam.

2. Description of the Prior Art

Various light beam scanning recording apparatuses have heretofore been used wherein a light beam, which serves as recording light, is modulated in accordance with an image signal, a recording material (such as a photosensitive material) is scanned with the modulated light beam, and a continuous tone image represented by the image signal is thereby recorded on the recording material. Ordinarily, in such light beam scanning recording apparatuses, semiconductor lasers are utilized as the recording light beam sources. A semiconductor laser has various advantages over a gas laser, or the like, in that the semiconductor laser is small in size, cheap and consumes little power, and in that the laser beam can be modulated directly.

However, it is known that a mode hopping phenomenon occurs with a single-longitudinal-mode semiconductor laser due to a change in the ambient temperature, a change in the drive current, or the like. If the mode hopping phenomenon occurs, the amount of the laser beam produced by the semiconductor laser will fluctuate, or the wavelength of the produced laser beam will fluctuate. If the mode hopping phenomenon occurs with a semiconductor laser, which is employed as a recording light source in a light beam scanning recording apparatus, there will be the risk that nonuniformity in image density occurs in a recorded image due to fluctuations in the amount of the recording light and the dependence of the sensitivity of a recording material upon the wavelength of the recording light.

A method for coping with the mode hopping phenomenon has been proposed in, for example, Japanese Patent Publication No. 59(1984)-9086. With the proposed method, a radio-frequency current is superimposed upon a drive current for a semiconductor laser, and the single-longitudinal-mode semiconductor laser is thereby caused to oscillate in a multiple longitudinal mode.

In cases where a radio-frequency current is superimposed upon a drive current for a semiconductor laser, the degree of modulation (=amplitude/maximum optical output power) of the optical output power of the semiconductor laser by the superimposition of the radio-frequency current has heretofore been set at approximately 100%. However, in cases where such a degree of modulation is to be obtained in a light beam scanning recording apparatus, wherein the laser beam produced by the semiconductor laser is modulated directly, it is necessary to use a semiconductor laser having a very high maximum rating, and therefore the cost of the light beam scanning recording apparatus cannot be kept low. Such problems will hereinbelow be described in detail.

Ordinarily, the image density of a continuous tone image, which is recorded by the light beam scanning recording apparatus, falls within the range of 0 to 3.0. (The term "image density" as used herein means the optical density.) By way of example, it is assumed that an optical output power of the semiconductor laser of 3.3 mW is required in order to record an image with a maximum optical density of approximately 3.0. In cases where a radio-frequency current is superimposed upon the drive current for the semiconductor laser, the image density of the recorded image is determined by the mean value of the optical output power. Therefore, as illustrated in FIG. 4, in order for a mean optical output power of 3.3 mW to be obtained with a degree of modulation of 100%, it becomes necessary that a semiconductor laser having a maximum rating of two times of 3.3 mW, i.e. a maximum rating of 6.6 mW, is employed. On the other hand, semiconductor lasers having only the limited levels of maximum ratings are available commercially. For example, as for semiconductor lasers producing laser beams having wavelengths falling in a 780 nm band, the popularly available semiconductor lasers come in three types of maximum ratings, i.e. 5 mW, 20 mW, and 30 mW. Therefore, in cases where a semiconductor laser having a maximum optical output power of 6.6 mW is necessary, a semiconductor laser having a maximum rating of 20 mW must be selected from those available commercially. As a result, the cost of the light beam scanning recording apparatus cannot be kept low.

As described above, the problems occur with regard to an example of the maximum optical output power of the semiconductor laser, which is required in order to obtain a maximum recorded image density, and maximum ratings of commercially available semiconductor lasers. The same problems also occur in other examples. Thus if a semiconductor laser having a high maximum optical output power is required in order to carry out the superimposition of a radio-frequency current, the cost of the light beam scanning recording apparatus cannot be kept low.

SUMMARY OF THE INVENTION

The primary object of the present invention is to provide a light beam scanning recording apparatus, wherein a single-longitudinal-mode semiconductor laser is employed as a recording light beam source such that nonuniformity in image density may not occur in a recorded image, and wherein the cost of the light beam scanning recording apparatus does not become markedly high due to countermeasures for nonuniformity in image density.

The present invention provides a light beam scanning recording apparatus, in which a recording material is scanned with a laser beam having been produced by a single-longitudinal-mode semiconductor laser and having been directly modulated in accordance with an image signal, and a continuous tone image is thereby recorded on the recording material, wherein the improvement comprises the provision of a means for superimposing a radio-frequency current upon a drive current for the semiconductor laser, an amplitude of the radio-frequency current being set at a value, which causes the semiconductor laser to oscillate in a multiple longitudinal mode, when the drive current for the semiconductor laser falls within a range such that an optical output power yielding a recorded optical density of not higher than approximately 2.0 may be obtained.

With the light beam scanning recording apparatus in accordance with the present invention, when the semiconductor laser produces an optical output power having a level such that the recorded image density may be not higher than approximately 2.0, the semiconductor laser is caused to oscillate in the multiple longitudinal mode by the effects of the superimposition of the radio-frequency current. As a result, in the thus recorded image, nonuniformity in image density due to the mode hopping phenomenon becomes imperceptible.

When the semiconductor laser produces an optical output power having a level such that the recorded image density may be higher than approximately 2.0, the amplitude becomes small with respect to the high optical output power, and therefore the semiconductor laser does not oscillate in the multiple longitudinal mode. However, research carried out by the inventor revealed that, in cases where the recorded image density is higher than 2.0, even if the recorded image density fluctuates due to the mode hopping phenomenon, such fluctuations in the image density are not perceived as nonuniformity in the image density. Therefore, practically, the image quality of the recorded image is not adversely affected by such fluctuations in the image density.

In cases where the natural light emission region of the semiconductor laser is also utilized to record the image, if the amplitude of the radio-frequency current is set in the manner described above, it will often occur that the degree of modulation of the optical output power becomes markedly lower than 100 % during the light emission of the semiconductor laser in the region, in which the slope efficiency is very low, and the mode hopping phenomenon cannot be restricted. However, in such cases, the recorded image density is as low as, for example, approximately 0.5 or less. In such a low image density range, as in the aforesaid high image density range, fluctuations in the recorded image density due to the mode hopping phenomenon are imperceptible as nonuniformity in the image density, and therefore no problem occurs practically.

When the amplitude of the radio-frequency current is comparatively small as described above, a semiconductor laser having a lower maximum rating can be utilized. Specifically, as described above, in cases where a maximum recorded image density of 3.0 is obtained when the mean optical output power of the semiconductor laser is 3.3 mW, the recorded image density becomes, for example, not higher than 2.0 when the mean optical output power of the semiconductor laser is not higher than 1.0 mW. Therefore, as illustrated in FIG. 2, in cases where the degree of modulation of the optical output power is set at approximately 100 % and the semiconductor laser is caused to oscillate in the multiple longitudinal mode when the mean optical output power of the semiconductor laser is 1.0 mW, the amplitude of the radio-frequency current may be set at a value such that the amplitude of the optical output power of the semiconductor laser may be 2.0 mW. In such cases, the maximum optical output power, which is necessary for obtaining a mean optical output power of the semiconductor laser of 3.3 mW that yields a recorded image density of 3.0, becomes equal to 3.3+2.0/2=4.3 mW. Therefore, in such cases, a semiconductor laser having a maximum rating of 5 mW can be used as the recording light beam source. Accordingly, the cost of the light beam scanning recording apparatus can be kept lower than when a semiconductor laser having a maximum rating of 20 mW is used.

DESCRIPTION OF THE PREFERRED EMBODIMENTS

The present invention will hereinbelow be described in further detail with reference to the accompanying drawings.

Figure 1:
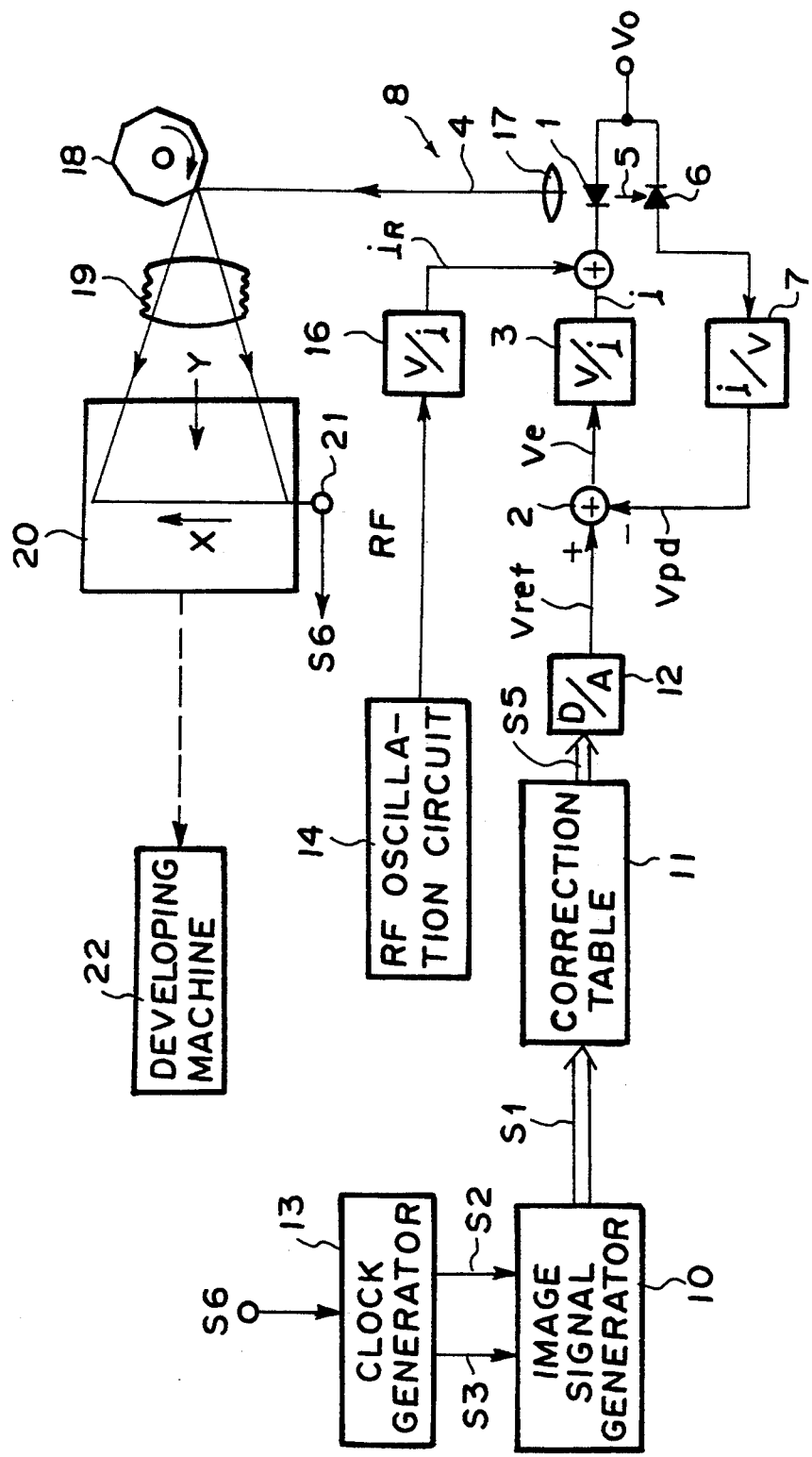
FIG. 1 is a schematic view showing an embodiment of the light beam scanning recording apparatus in accordance with the present invention.
Figure 2:
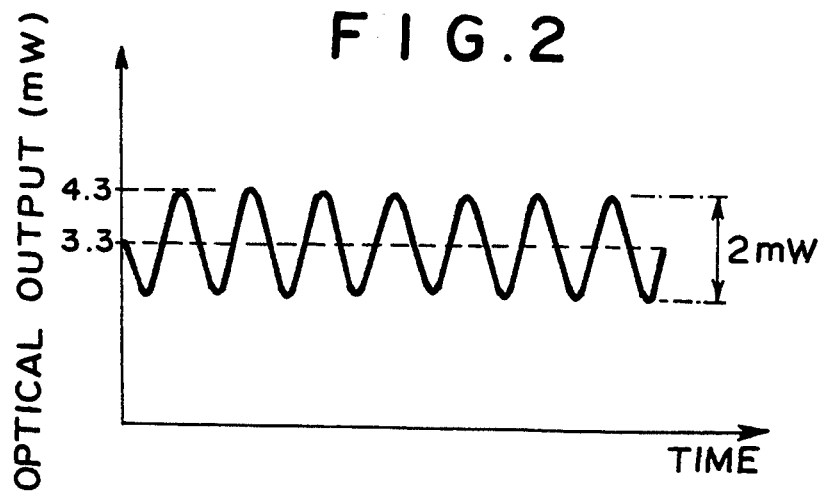
FIG. 2 is a graph showing a change in an optical output power of a semiconductor laser due to superimposition of a radio-frequency current in the embodiment of FIG. 1.

FIG. 1 shows an embodiment of the light beam scanning recording apparatus in accordance with the present invention. With reference to FIG. 1, an image signal generator 10 generates an image signal S1 representing a continuous tone image. By way of example, the image signal S1 is a digital signal representing a continuous tone image of a density scale of 10 bits. The image signal generator 10 changes over the signal corresponding to a single main scanning line on the basis of a line clock pulse S2, which will be described later. Also, the image signal generator 10 outputs the image signal S1 corresponding to each picture element in accordance with a picture element clock pulse S3.

The image signal S1 is fed into a correction table 11 comprising a RAM, or the like, and subjected to gradation correction, an inverse logarithmic conversion, and a conversion process for eliminating nonlinearity of the optical output characteristics of a semiconductor laser with respect to a drive current. The image signal S1 is thereby converted into a light emission level instructing signal S5 of, for example, 16 bits. The light emission level instructing signal S5 is fed into a D/A converter 12, and is converted by the D/A converter 12 into a light emission level instructing signal Vref, which is composed of an analog voltage signal. The light emission level instructing signal Vref is fed into an addition point 2 of an automatic power control (APC) circuit 8 and then into a voltage-to-current conversion amplifier 3. The voltage-to-current conversion amplifier 3 feeds a drive current, which is proportional to the light emission level instructing signal Vref, into a single-longitudinal-mode semiconductor laser 1. A laser beam 4 having a wavelength of 780 nm is produced by the semiconductor laser 1 and is radiated forwardly. The laser beam 4 is utilized to scan a photosensitive material by a beam scanning system, which will be described later.

A laser beam 5 is radiated rearwardly from the semiconductor laser 1. The intensity of the laser beam 5 is detected by a photodiode 6, which monitors the laser beam intensity and is located in a housing of the semiconductor laser 1. The intensity of the laser beam 5 thus detected is proportional to the intensity of the laser beam 4, which is utilized to record an image. The intensity of the laser beam 5, i.e., the output current of the photodiode 6 representing the intensity of the laser beam 4, is converted by a current-to-voltage conversion amplifier 7 into a feedback signal (a voltage signal) Vpd. The feedback signal Vpd is fed into the addition point 2. From the addition point 2, a deviation signal Ve is fed out which represents the amount of deviation between the light emission level instructing signal Vref and the feedback signal Vpd. The deviation signal Ve is converted by the voltage-to-current conversion amplifier 3 into a current, which drives the semiconductor laser 1. When control is thus effected, the intensity of the laser beam 5 can be kept at a predetermined value with respect to a predetermined level of the light emission level instructing signal Vref.

The laser beam 4 is collimated by a collimator lens 17, and is then reflected and deflected by a light deflector 18, which may be constituted of a polygon mirror, or the like. The laser beam 4, which has thus been deflected, is passed through a converging lens 19, which may normally be constituted of an fθ lens. The laser beam 4 is thereby converged into a minute spot on a photographic material 20 and caused to scan the photographic material 20 in a main scanning direction indicated by the arrow X. The photographic material 20 is moved by a movement means (not shown) in a sub-scanning direction indicated by the arrow Y, which direction is approximately normal to the main scanning direction indicated by the arrow X. The photographic material 20 is thus scanned with the laser beam 4 in the sub-scanning direction Y. In this manner, the photographic material 20 is two-dimensionally scanned with and exposed to the laser beam 4. Since the intensity of the laser beam 4 is modulated in accordance with the image signal S1 as mentioned above, the continuous tone image which the image signal S1 represents is recorded as a photographic latent image on the photographic material 20. Thereafter, the photographic material 20 is sent to a developing machine 22 and is subjected to a development process. In this manner, the continuous tone image is developed as a visible image on the photographic material 20.

When the laser beam 4 scans the photographic material 20, passage of the laser beam 4 over a start point of the main scanning is detected by a photodetector 21. A start point detection signal S6 is generated by the photodetector 21 and fed into a clock generator 13. The clock generator 13 outputs the aforesaid line clock pulse S2 and the picture element clock pulse S3 in synchronization with the timing, with which the start point detection signal S6 is fed thereinto.

Figure 3:
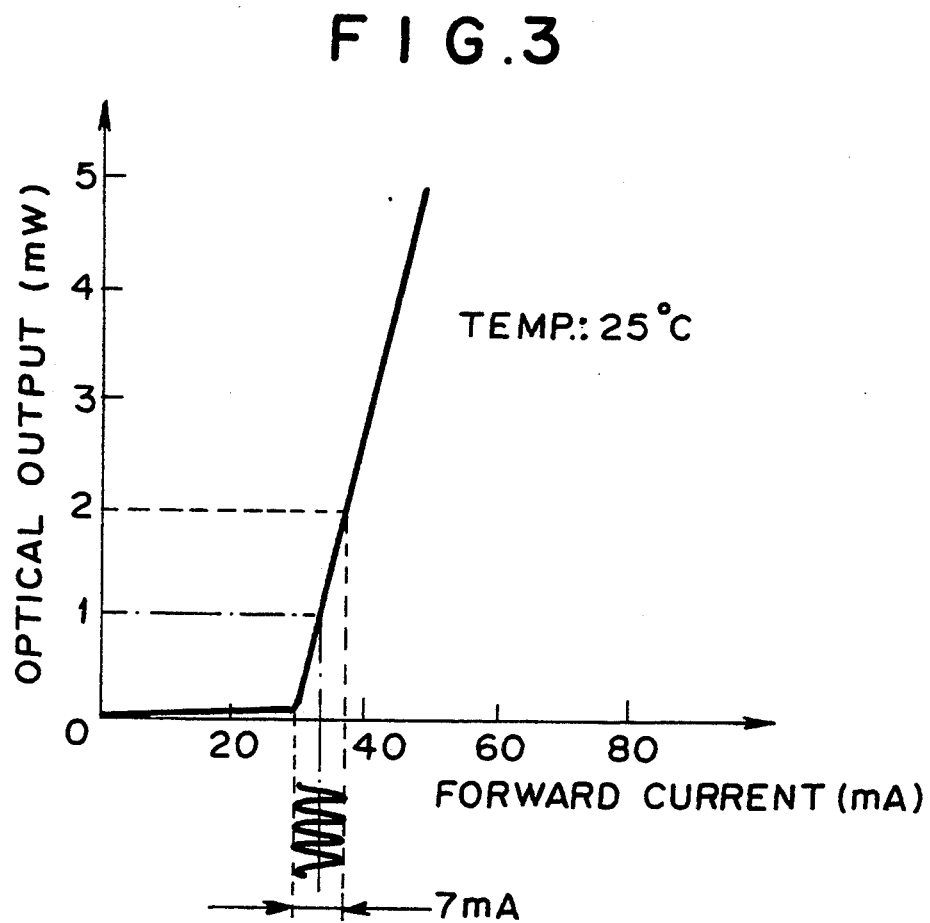
FIG. 3 is a graph showing optical output characteristics of a semiconductor laser with respect to a drive current, and Showing an amplitude of a radio-frequency current.
Figure 4:
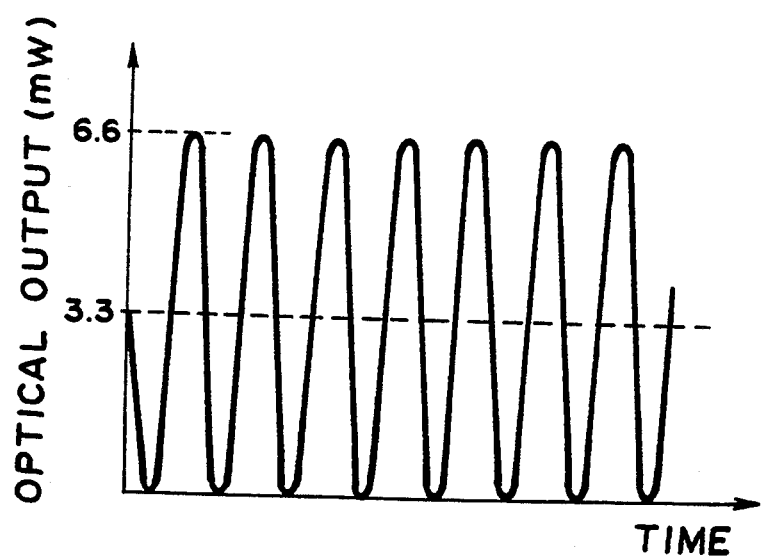
FIG. 4 is a graph showing a change in an optical output power of a semiconductor laser due to superimposition of a radio-frequency current in a conventional apparatus.

The direct drive current i for the semiconductor laser 1 is fed out of the voltage-to-current conversion amplifier 3 of the APC circuit 8. A radio-frequency current iR is superimposed upon the drive current i. The radio-frequency current iR is obtained by passing a radio-frequency signal (a voltage signal) RF, which has been fed out of a radio-frequency oscillation circuit 14, through a voltage-to-current conversion amplifier 16. The frequency of the radio-frequency current iR is set at, for example, 50 MHz. The semiconductor laser 1 has the optical output characteristics with respect to the drive current, which are shown in FIG. 3. If a radio-frequency current is superimposed upon the drive current such that the degree of modulation of the optical output power of the semiconductor laser 1 may be approximately 100%, the semiconductor laser 1 will oscillate in the multiple longitudinal mode.

The image density (optical density) of the image recorded on the photographic material 20 becomes maximum (3.0) when the mean optical output power of the semiconductor laser 1 is 3.3 mW. When the mean optical output power of the semiconductor laser 1 is approximately 1.0 mW, the image density of the recorded image is 2.0. Therefore, by way of example, the amplitude of the radio-frequency current iR is set at a value such that the amplitude of the optical output power of the semiconductor laser in the laser oscillation region may become 2.0 mW. Specifically, as shown in FIG. 3, the amplitude of the radio-frequency current iR is set at approximately 7 mA p-p.

In the manner described above, the radio-frequency current iR is superimposed upon the drive current for the semiconductor laser 1. In such cases, when the image density of the image recorded on the photographic material 20 is not higher than 2.0, the degree of modulation of the optical output power of the semiconductor laser 1 becomes approximately 100%, and therefore the semiconductor laser 1 oscillates in the multiple longitudinal mode. Therefore, the mode hopping phenomenon of the semiconductor laser 1 is restricted, and nonuniformity in the image density can be prevented from occurring in the recorded image.

In cases where the drive current i is fed into the semiconductor laser 1 such that the image density of the recorded image may be higher than 2.0, the degree of modulation of the optical output power of the semiconductor laser 1 becomes lower than 100%. For example, in cases where the mean optical output power of the semiconductor laser 1 is 3.3 mW, which corresponds to the maximum recorded image density of 3.0, the degree of modulation of the optical output power of the semiconductor laser 1 becomes equal to $2.0/\{3.3+(2.0/2)\}\times 100 = 47\%$. Therefore, in cases where the image density of the recorded image is higher than approximately 2.0, the semiconductor laser 1 does not oscillate in the multiple longitudinal mode, and the mode hopping phenomenon may occur. However, as described above, even if the recorded image density fluctuates due to the mode hopping phenomenon in the high image density range, such fluctuations in the image density is imperceptible as nonuniformity in the image density, and actually the image quality of the recorded image is not adversely affected by such fluctuations in the image density.

In cases where the amplitude of the optical output power of the semiconductor laser 1 due to the superimposition of the radio-frequency current iR is 2.0 mW, in order for the mean optical output power of the semiconductor laser 1 of 3.3 mW to be obtained, which yields the maximum recorded image density of 3.0, it is sufficient for the maximum optical output power of the semiconductor laser 1 to be $3.3+(2.0/2)=4.3$ mW. Therefore, as the semiconductor laser 1, a commercially available semiconductor laser having the maximum rating of 5 mW can be used. Accordingly, the cost of the light beam scanning recording apparatus can be kept lower than when a semiconductor laser having a higher maximum rating, i.e. the maximum rating of 20 mW, is used.

In this embodiment, even if the light emission level instructing signal Vref represents an image density of zero, a current falling within the range of approximately 5 to 20 mA, which is lower than the threshold value current, flows through the semiconductor laser 1. In this manner, the rising of the operation of the semiconductor laser 1 at the time of feeding of a large current can be kept good. Also, the drive current can be prevented from becoming a minus value due to the superimposition of the radio-frequency current iR. Also, even if the semiconductor laser 1 is working in the natural light emission region with such a weak current, no photographic fog occurs on the photographic material 20.

The mean optical output power of the semiconductor laser, which yields a recorded image density of 2.0, and the amplitude of the optical output power are not limited to the values in the aforesaid embodiment and may be selected appropriately in accordance with the characteristics of the recording material, or the like.

What is claimed is:

1. A light beam scanning recording apparatus, in which a recording material is scanned with a laser beam having been produced by a single-longitudinal mode semiconductor laser and having been directly modulated in accordance with an image signal, and a continuous tone image is thereby recorded on the recording material, wherein the improvement comprises means for superimposing a radio-frequency current upon a drive current of said semiconductor laser; and for setting an amplitude of said radio-frequency current at a value which causes said semiconductor laser to oscillate in a multiple longitudinal mode only when said drive current of said semiconductor laser falls within a range; wherein said range corresponds to an optical output power yielding a recorded optical density of not higher than 2.0.

2. An apparatus as defined in claim 1 wherein the recording material is a photographic material.

* * * * *